(12) United States Patent
Banerjee et al.

(10) Patent No.: US 8,374,037 B2
(45) Date of Patent: *Feb. 12, 2013

(54) METHOD FOR PROGRAMMING A SEMICONDUCTOR MAGNETIC MEMORY INTEGRATING A MAGNETIC TUNNELING JUNCTION ABOVE A FLOATING-GATE MEMORY CELL

(75) Inventors: Parag Banerjee, Boise, ID (US); Terry Gafron, Boise, ID (US); Fernando Gonzalez, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 21 days.

This patent is subject to a terminal disclaimer.

(21) Appl. No.: 13/186,796

(22) Filed: Jul. 20, 2011

(65) Prior Publication Data

US 2011/0273929 A1   Nov. 10, 2011

Related U.S. Application Data

(60) Continuation of application No. 12/966,430, filed on Dec. 13, 2010, now Pat. No. 7,995,402, which is a division of application No. 12/360,496, filed on Jan. 27, 2009, now Pat. No. 7,852,668, which is a division of application No. 11/447,709, filed on Jun. 6, 2006, now Pat. No. 7,486,550.

(51) Int. Cl.
*G11C 16/10* (2006.01)
(52) U.S. Cl. ......... 365/185.28; 365/185.31; 365/185.29; 365/185.17; 365/173; 365/171
(58) Field of Classification Search ............. 365/185.28, 365/185.31, 185.29, 185.05, 185.17, 185.03, 365/158, 173, 171
See application file for complete search history.

(56) References Cited

U.S. PATENT DOCUMENTS

| | | | |
|---|---|---|---|
| 6,034,887 A | 3/2000 | Gupta et al. | |
| 6,473,336 B1 | 10/2002 | Nakajima et al. | |
| 6,522,573 B2 | 2/2003 | Saito et al. | |
| 6,545,900 B2 | 4/2003 | Bohm et al. | |
| 6,570,787 B1 | 5/2003 | Wang et al. | |
| 6,573,586 B2 | 6/2003 | Sakata et al. | |
| 6,597,618 B2 | 7/2003 | Zheng et al. | |
| 6,754,100 B1 | 6/2004 | Hayakawa | |
| 6,842,368 B2 | 1/2005 | Hayakawa | |
| 6,845,038 B1 | 1/2005 | Shukh | |
| 6,849,464 B2 | 2/2005 | Drewes | |
| 6,885,582 B2 | 4/2005 | Sharma | |
| 6,944,049 B2 | 9/2005 | Hoenigschmid et al. | |
| 6,977,839 B2 | 12/2005 | Sharma | |
| 6,992,923 B2 | 1/2006 | Kim et al. | |
| 7,020,010 B2 | 3/2006 | Moriyama et al. | |
| 7,486,550 B2 | 2/2009 | Banerjee et al. | |
| 7,852,668 B2 | 12/2010 | Banerjee et al. | |

(Continued)

OTHER PUBLICATIONS

Yin, Cheng-Kuan, et al. "New Magnetic Flash Memory with FePt Magnetic Floating Gate" *Japanese Journal of Applied Physics* vol. 45, No. 4B, 2006, pp. 3217-3221.

*Primary Examiner* — Andrew Q Tran
(74) *Attorney, Agent, or Firm* — Leffert Jay & Polglaze, P.A.

(57) ABSTRACT

A semiconductor magnetic memory device has a magnetic tunneling junction formed over a memory cell. The memory cell has a control gate surrounded by a floating gate. The floating gate is coupled to the magnetic tunneling junction through a pinning layer that maintains the magnetic orientation of the lower magnetic layer of the junction. A current through a selected word line, coupled to the control gate, generates a first magnetic field. A current through a cell select line generates a second magnetic field that is orthogonal to the first magnetic field. This changes the magnetic orientation of the upper magnetic layer of the junction to lower its resistance, thus allowing a write/erase voltage on a program/erase line to program/erase the floating gate.

19 Claims, 11 Drawing Sheets

U.S. PATENT DOCUMENTS 7,995,402 B2 * 8/2011 Banerjee et al. ......... 365/185.31
8,223,560 B2 * 7/2012 Jin et al. ................... 365/185.28
2003/0214842 A1 11/2003 Jeong
2004/0100817 A1 5/2004 Subramanian et al.

* cited by examiner

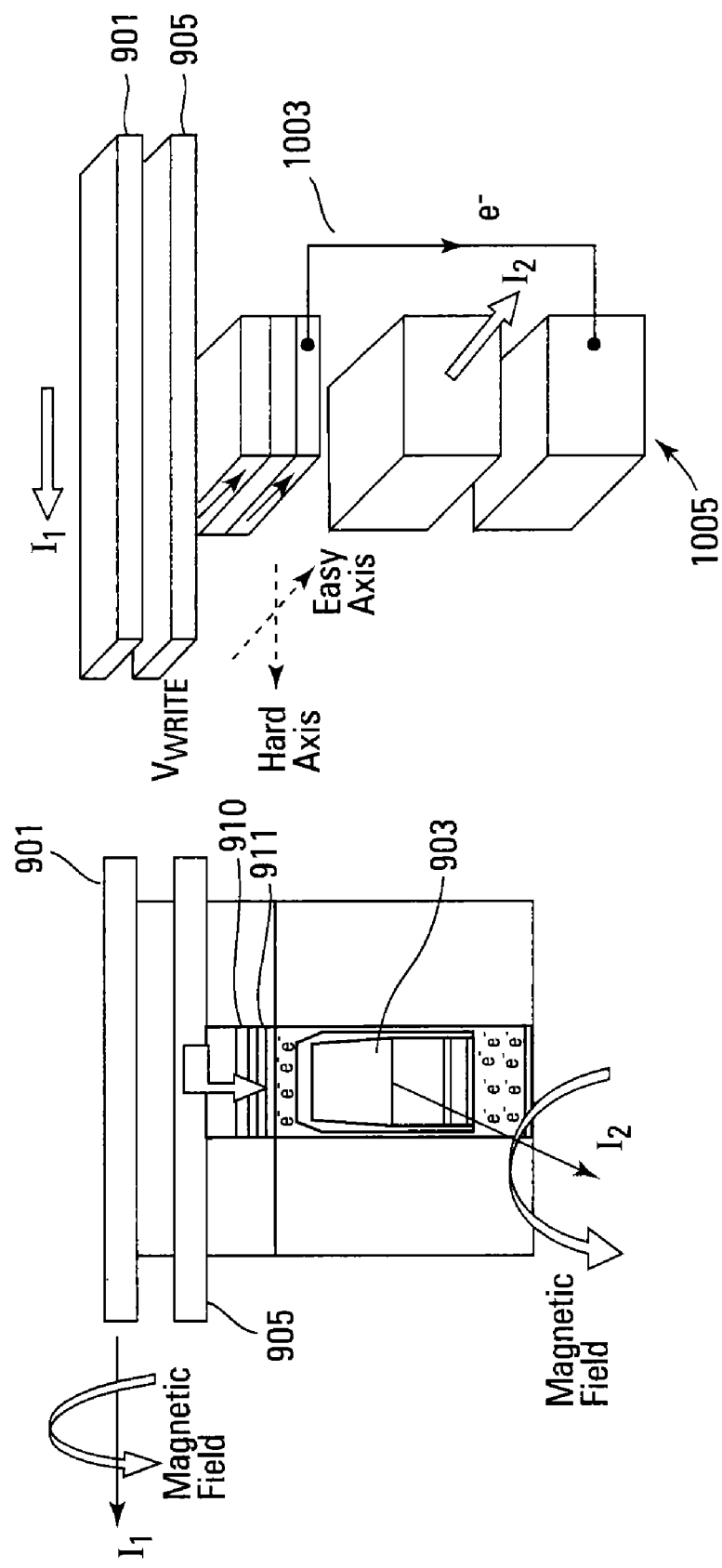

METHOD FOR PROGRAMMING A SEMICONDUCTOR MAGNETIC MEMORY INTEGRATING A MAGNETIC TUNNELING JUNCTION ABOVE A FLOATING-GATE MEMORY CELL

RELATED APPLICATION

This is a continuation of U.S. application Ser. No. 12/966,430, titled "SEMICONDUCTOR MAGNETIC MEMORY INTEGRATING A MAGNETIC TUNNELING JUNCTION ABOVE A FLOATING-GATE MEMORY CELL," filed Dec. 13, 2010 now U.S. Pat. No. 7,995,402 (allowed), which is a divisional of Ser. No. 12/360,496 U.S. Pat. No. 7,852,668, titled "SEMICONDUCTOR MAGNETIC MEMORY INTEGRATING A MAGNETIC TUNNELING JUNCTION ABOVE A FLOATING-GATE MEMORY CELL," filed Jan. 27, 2009, which is a divisional of Ser. No. 11/447,709 U.S. Pat. No. 7,486,550, titled "SEMICONDUCTOR MAGNETIC MEMORY INTEGRATING A MAGNETIC TUNNELING JUNCTION ABOVE A FLOATING-GATE MEMORY CELL," filed Jun. 6, 2006, that are all commonly assigned and incorporated herein by reference.

TECHNICAL FIELD

The present invention relates generally to memory devices and in particular the present invention relates to semiconductor magnetic memory architecture.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As the performance and complexity of electronic systems increase, the speed of the system memory needs to increase as well. However, one of the disadvantages of flash memory is the slow programming and erase speeds. Typical prior art programming uses either Fowler-Nordheim tunneling or hot electron injection to move a charge from a channel in the substrate onto the floating gate. The mechanism by which they tunnel through the oxide/insulator layer damages the layer. This limits the number of times that a flash memory device can be programmed reliably before the dielectric wears out and loses its insulating properties.

The flash road map requires a memory cell structure change due to the scaling limitations of the floating gate technology. The floating gate stack has a problem with capacitive coupling to neighboring cells causing disturb problems. By lowering the stack height, the capacitance can be reduced. One approach is to eliminate the floating gate and use a SONOS approach to storing charge in the dielectric layer itself. A second approach that enhances the SONOS structure is to add nano-crystals under the word line poly.

For the reasons stated above, and for other reasons stated below which will become apparent to those skilled in the art upon reading and understanding the present specification, there is a need in the art for a memory device that operates faster and has a longer life.

BRIEF DESCRIPTION OF THE DRAWINGS

FIG. 9 shows a cross-sectional view of one embodiment of a programming operation of the present invention.

FIG. 10 shows a cross-sectional view of one embodiment of the programming operation of the present invention.

DETAILED DESCRIPTION

Figure 1:
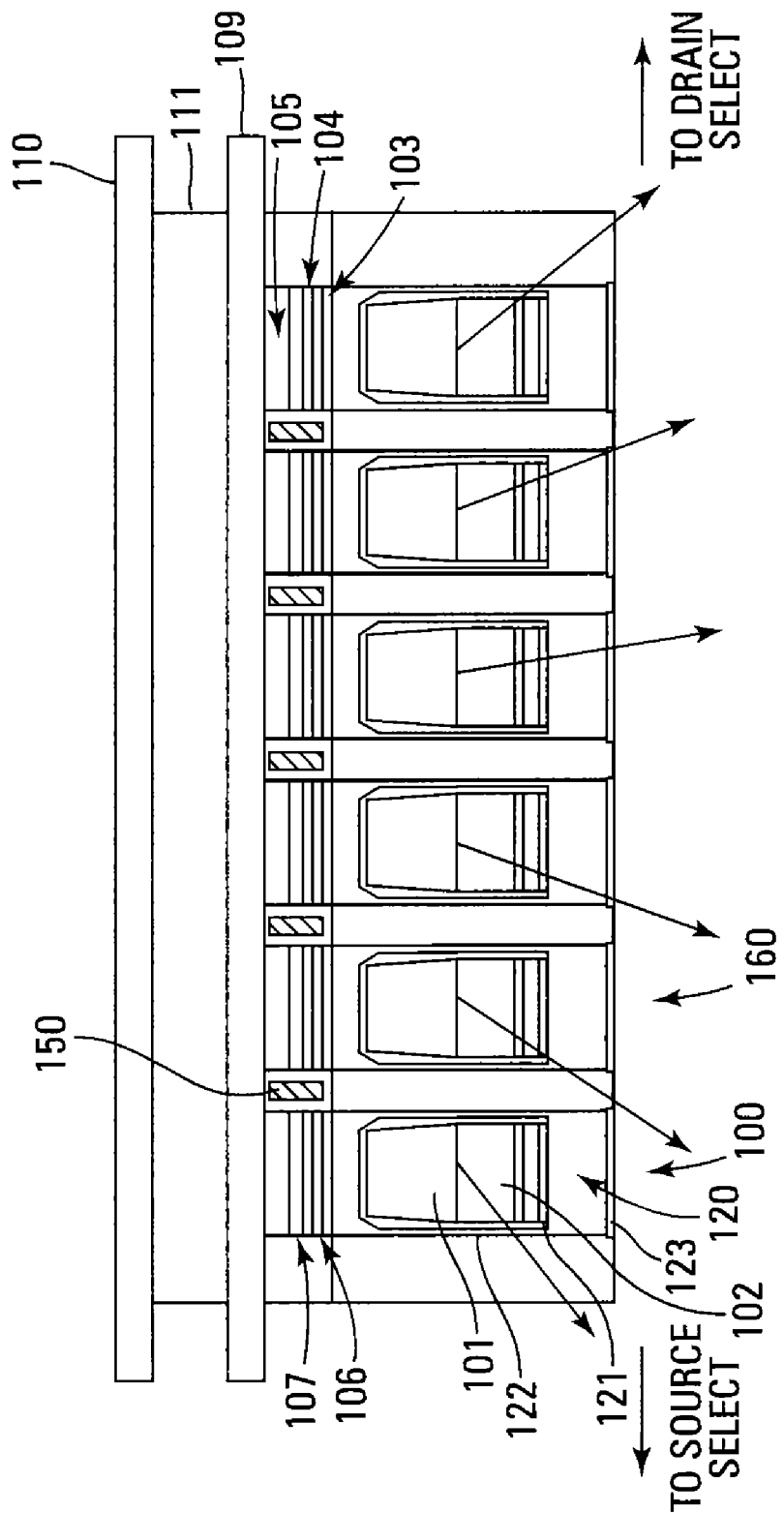
FIG. 1 shows a cross-sectional view of one embodiment of a semiconductor magnetic memory device of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

The semiconductor magnetic memory device of the present invention is comprised of a memory array that incorporates floating gate memory cells with a magnetic tunnel junction (MTJ) layer. The MTJ layer uses the Giant Magneto Resistance Effect to turn on and off each cell, thus allowing access to the floating gate for storage of a charge.

FIG. 1 illustrates a cross-sectional view of one embodiment of the structure of the magnetic memory device of the present invention. The embodiment of FIG. 1 is for a NAND architecture memory array. In the interest of clarity, only one cell structure will be described. However, each cell of the magnetic memory array of the present invention is constructed in substantially the same way.

Each cell 100 is comprised of a floating gate 120 that wraps around the control gate 101, 102. In one embodiment, the floating gate 120 is comprised of polysilicon. Alternate embodiments can use other materials.

A tunnel insulator layer 123, in one embodiment, is formed of an oxide material under the floating gate. Alternate embodiments can use other insulator materials.

The control gate/word line 101, 102 is located within the floating gate 120. The control gate is comprised of two layers 101, 102. The upper layer, in one embodiment, is a tungsten silicide (WSi$_x$) layer 101. Tungsten silicide may also be referred to in the art as polycide. The lower layer 102, in one embodiment, is comprised of polysilicon. Alternate embodiments can use other materials for either of these layers.

The control gates of each cell are coupled together by the word lines of the array. FIG. 1 shows arrows coming out of the plane of the paper to indicate that the axis of the word lines extends into and out of the plane of the figure.

An insulating layer of nitride 122 is formed around the control gate 101, 102. This layer insulates the control gate 101, 102 from the floating gate 120. An oxide-nitride-oxide layer 121 is formed at the bottom of the control gate 101, 102 to further separate the control gate 101, 102 and the floating gate 120.

The MTJ can be comprised of an antiferromagnetic layer separated from a ferromagnetic layer by a relatively thin dielectric material. The dielectric should be thin enough to allow spin dependent electron tunneling while still forming a robust barrier to electrons that are not spin polarized. Also, it is desirable that the materials used for the barrier do not translate crystalline structure or contribute magnetic properties to the MTJ.

The MTJ layer is formed over the floating gate 120 of each cell 100. Immediately adjacent to the floating gate is the pinning layer 103. This layer 103 can be comprised of a synthetic antiferromagnet such as combinations of manganese and a metal. Combinations can include iridium manganese, platinum manganese, iron manganese, and chromium platinum manganese. The pinning layer 103 is responsible for fixing the magnetic orientation of the lower magnetic layer 106. Alternate embodiments can use other materials and/or material combinations for this layer 103.

The lower magnetic layer 106 is therefore the fixed magnetic layer 106 while the upper magnetic layer 107 changes magnetic orientation in response to the current flow as described subsequently with reference to the programming and erasing methods of FIGS. 10-13. Both the fixed magnetic layer 106 and the free magnetic layer 107 can be comprised of high susceptibility magnetic material such as cobalt, iron, or nickel. Additionally, combinations of these materials can be used to enhance their magnetic properties such as nickel iron and cobalt iron. Niobium, hafnium, and boron may be used in varying combinations to prevent migration or dilution of the magnetic materials at the interface boundaries. Alternate embodiments can use other materials and/or material combinations for these layers.

A tunneling barrier 104 is formed between the fixed magnetic layer 106 and the free magnetic layer 107. The tunneling barrier 104 is a relatively thin dielectric film that separates the two magnetic layers 106, 107. In one embodiment, the tunneling barrier 104 is comprised of an oxide material such as aluminum oxide, titanium oxide, or manganese oxide. Additionally, materials such as silicon dioxide or hafnium oxide can be used. Alternate embodiments can use other materials for this layer 104 that do not introduce undesirable magnetic properties.

An optional layer of relatively thin ruthenium can be inserted between the antiferromagnetic layer and the ferromagnetic layer in order to enhance the magnetic coupling of the synthetic antiferromagnet. Other oscillatory exchange materials can include chromium, rhodium, iridium copper and their alloys.

The free magnetic layer 107 makes contact with a top electrode 105. The electrode 105 provides contact between the MTJ stack 103, 104, 106, 107 and the program/erase line 109. In one embodiment, the electrode is comprised of a metal material. Alternate embodiments can use other materials.

The program/erase line 109 is a single line that is orthogonal to the word lines of the array and ties together the series string columns of the array. The cell select line 110 is formed parallel to and above the program/erase line 109. These lines 109, 110 are separated by an insulating material 111 such as an oxide material.

The cell select line 110 is responsible for switching the magnetization of the free magnetic layer 107 of the MTJ layer. The orthogonality of the cell select lines 110 with the word lines 101, 102 provides the necessary selectivity require to program and erase each individual cell. The operation of the program/erase line 109 and the cell select line 110 is discussed further subsequently with reference to the program and erase embodiments of FIGS. 10-13.

Cross-talk between cells 100, 160 may be substantially reduced or eliminated by the addition of a thin layer of magnetic material that acts as a magnetic spacer 150. The spacers enhance the ability to reduce both cell spacing and cell size. This strategy uses high permeability materials such as nickel, iron, cobalt, or combinations of these materials to confine the magnetic flux produced by the MTJ devices. High permeability "flux keepers" are often applied to both increase the switching efficiency of the MTJ as well as reduce unwanted stray magnetic fields that may affect the performance or readability of adjacent bits.

Figure 2:
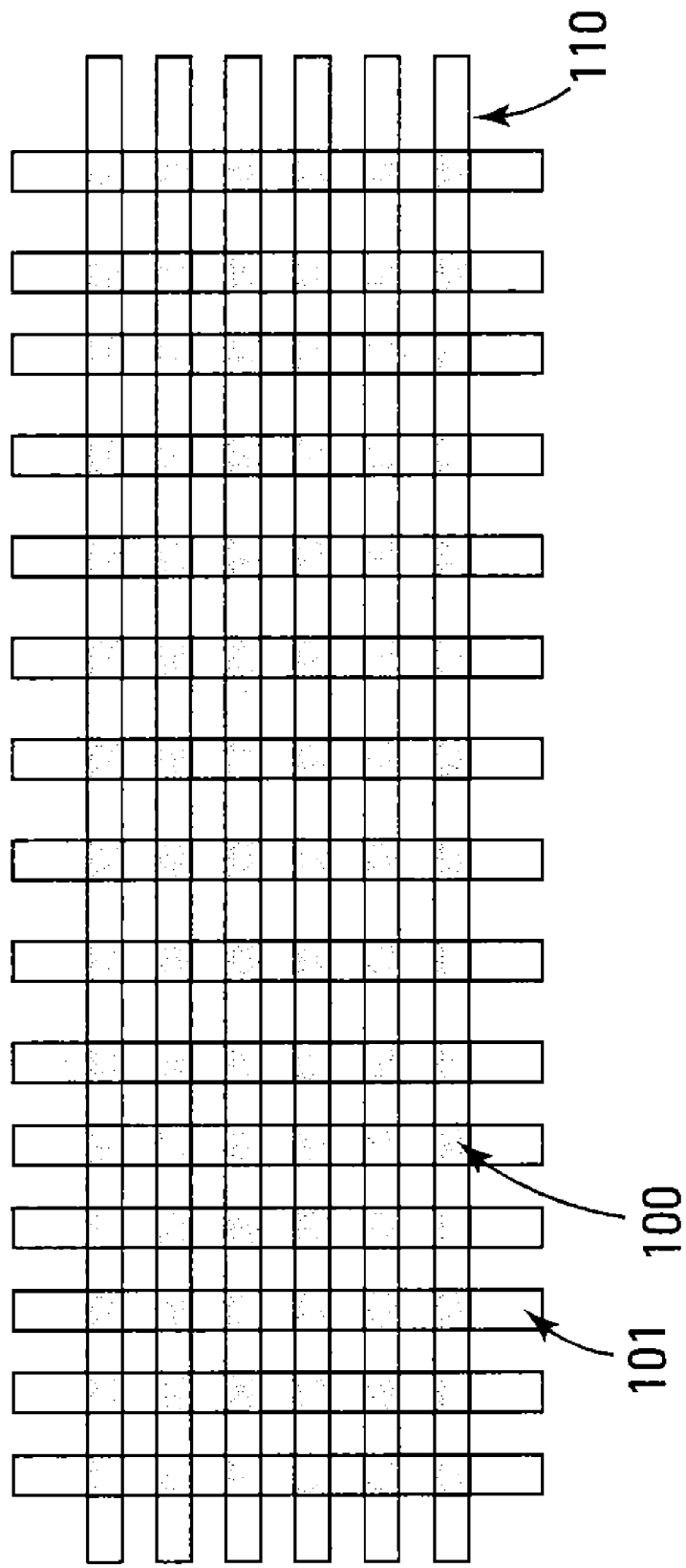
FIG. 2 shows a top plan view of one embodiment of the layout of the word lines/select lines of the present invention.

FIG. 2 illustrate a top plan view of one embodiment of the layout for the word lines and cell select/program erase lines of the present invention. The word lines 101 are shown running in the "y" direction. These lines include both the upper polycide layer 101 of the word line and the lower polysilicon layer 102. The cell select line 110 is shown running perpendicular to the word lines 101 in the "x" direction. The cell select line 110 is over the program/erase line 109. The intersection of each of the word lines and each of the select/program lines 101, 110 is over a memory cell 100 as described previously and shown in FIG. 1.

The following fabrication steps and materials for the magnetic memory device of the present invention are for purposes of illustration only. Alternate embodiments can use other materials than those disclosed and different fabrication steps in forming the structure of the present invention.

Figure 3:
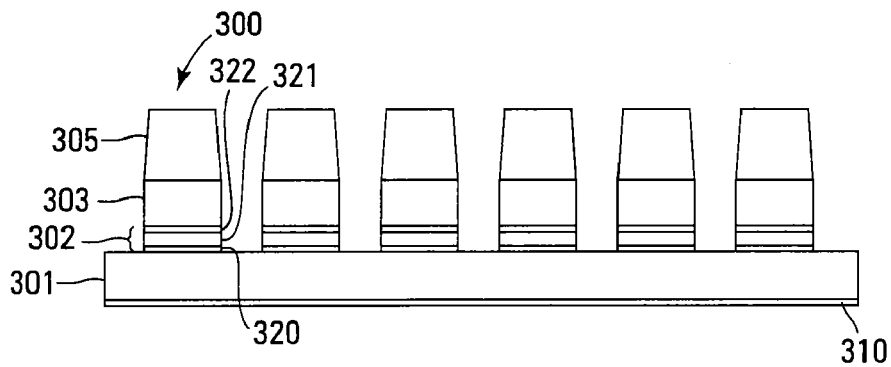
FIG. 3 shows a cross-sectional view of one embodiment of a fabrication step in accordance with the magnetic memory device of FIG. 1.

FIG. 3 illustrates a cross-sectional view of one embodiment of fabrication steps for the magnetic memory device of the present invention. A polysilicon layer 301 is formed over a tunneling layer 310. In one embodiment, the tunneling layer 310 is an oxide. Alternate embodiments can use other insulating materials.

The floating gate cell structure is comprised of an oxide 320 layer formed over the polysilicon layer 301. A nitride layer 321 is formed over the oxide layer. A second oxide layer 322 is formed over the nitride layer 321. These three layer 320-322 together form the ONO 320 insulator structure of the floating gate cell. The ONO can be replaced by a high-K or a combination of high-K and ONO layers to increase coupling capacitance between the word line and the substrate thereby reducing the operational voltages of these memory cells.

A poly silicon layer 303 is formed over the ONO layer 302 and a polycide (WSi$_x$) layer 305 is formed over the poly layer 303. Together these layer 303, 305 form the control gate/word line structure of the floating gate cell.

Figure 4:
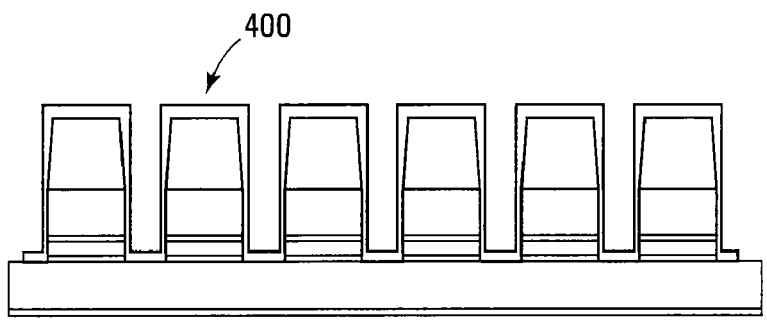
FIG. 4 shows a cross-sectional view of one embodiment of another fabrication step in accordance with the magnetic memory device of FIG. 1.

FIG. 4 illustrates a cross-sectional view of one embodiment of additional fabrication steps for the magnetic memory device of the present invention. In this figure, a nitride spacer 400 is formed over the structure of FIG. 3.

Figure 5:
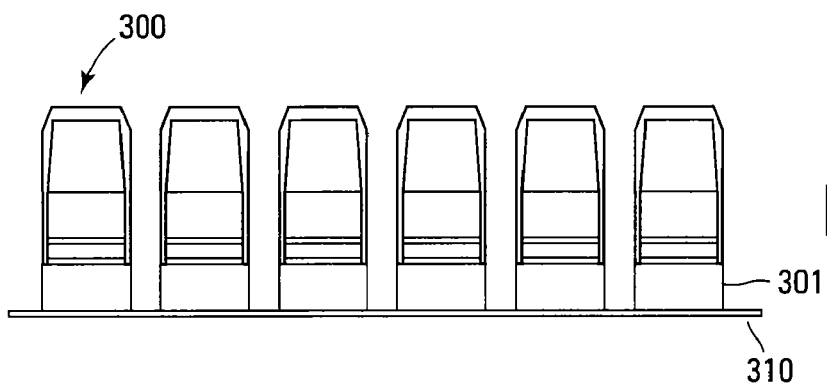
FIG. 5 shows a cross-sectional view of one embodiment of another fabrication step in accordance with the magnetic memory device of FIG. 1.

An in situ nitride and polysilicon etch is then performed in FIG. 5. This step removes portions of the nitride layer 400 of FIG. 4 and portions of the poly silicon layer 301 between each floating gate structure 300. This exposes the oxide layer 310 between each floating gate structure 300.

Figure 6:
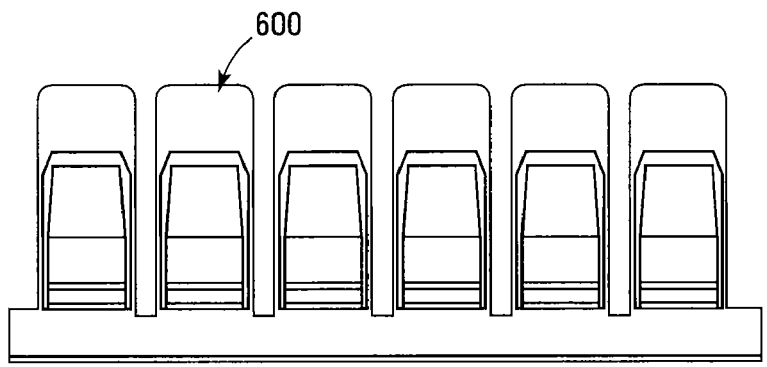
FIG. 6 shows a cross-sectional view of one embodiment of another fabrication step in accordance with the magnetic memory device of FIG. 1.
Figure 7:
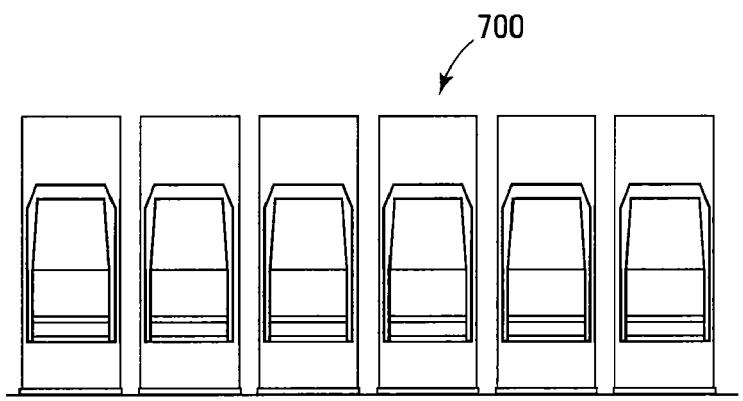
FIG. 7 shows a cross-sectional view of one embodiment of another fabrication step in accordance with the magnetic memory device of FIG. 1.

A blanket polysilicon 600 deposition is then performed as shown in FIG. 6. FIG. 7 shows the results of an in situ polysilicon etch and tunnel oxide etch of the tunnel oxide layer 310. This step forms the individual floating gates 700 that surround each cell structure. The tunnel oxide etch isolates each tunnel oxide layer for each individual cell.

Figure 8:
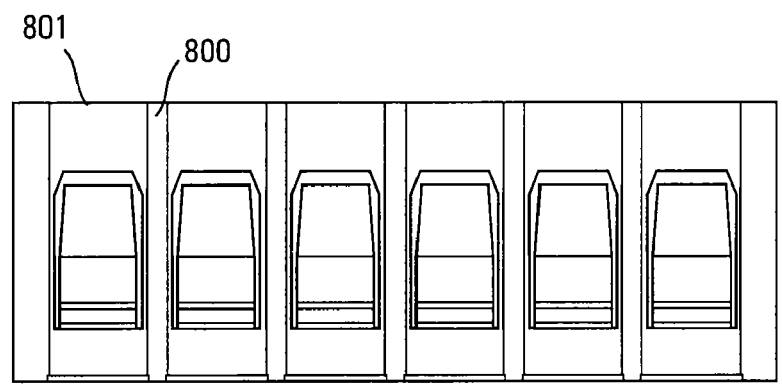
FIG. 8 shows a cross-sectional view of one embodiment of another fabrication step in accordance with the magnetic memory device of FIG. 1.

FIG. 8 a structure insulator 800 is then formed between each of the floating gate structures. This may be a low-k insulator. Also in this step, a nitride barrier 801 may be formed over the structure to act as a chemical mechanical planarization (CMP) stop layer for future steps.

A magnetic tunnel junction deposition and patterning is then performed to form the MTJ junction over each floating gate cell structure. Electrode deposition and program/erase line deposition with patterning forms the individual electrodes and program/erase line over each cell. The cell select line is then deposited over the oxide insulating layer and patterned, thus resulting in the structure illustrated in FIG. 1.

FIG. 9 illustrates a schematic cross-sectional view of one embodiment of a programming operation of the magnetic memory device of the present invention. The programming is performed by isolating a desired MTJ stack of the cell to be programmed. This is accomplished by passing currents through the specific cell select line 901 and word line 903 that are coupled to the cell to be programmed. The current through the cell select line 901 is denoted as $I_1$ and the current through the word line is denoted as $I_2$.

Currents $I_1$ and $I_2$ each create magnetic fields in the directions as shown in FIG. 9. The magnetic field created by $I_1$ causes the magnetic field in the free magnetic layer 910 to orient in the direction of magnetization of the lower pinned layer 911. This is referred to in the art as the "easy axis". This axis is illustrated in FIG. 10.

Current $I_2$ causes the magnetization of the free magnetic layer 910 to orient orthogonal to the direction of the pinned layer 911. This axis is referred to as the "hard axis" as illustrated in FIG. 10.

This combination of easy and hard axis orientation of the magnetic domains in the free layer 910 causes the resistance of the MTJ stack to drop at lower magnetic fields as compared to typical prior art stacks where the domains are oriented parallel/anti-parallel to each other. Additional information regarding orthogonal programming of easy and hard axes can be found in Tehrani et al., Proc. IEEE 91(5), (2003), pp. 703.

As shown in FIG. 10, a voltage $V_{write}$ is then applied on the program/erase line 905. This causes electrons 1003 to pass to the floating gate 1005 as a stored charge. The charge, Q, can be determined by $(V_{write}/R_{MTJ})*\Delta t$ where $R_{MTJ}$ is the resistance of the stack and $\Delta t$ is the time of the programming pulse. In one embodiment, the programming time can be measured in nanoseconds, depending on $V_{write}$ and the resistance of the MTJ.

In one embodiment, $V_{write}$ is a programming pulse with an amplitude in the range of 3V-10V. The $V_{write}$ voltages are substantially lower than what current flash memory parts use. This is a direct result of using an MTJ to program the cells instead of the power intensive Fowler-Nordheim approach or channel hot electron injection. $V_{write}$ can start at a lower write voltage and increase incrementally by a step voltage for any subsequent programming pulses required to properly program the non-volatile cell.

By modulating the time $\Delta t$, a variety of charges can be stored into the magnetic memory device of the present invention. Thus a plurality of threshold voltages can be programmed into the cell simply by opening the MTJ for a predetermined time period. This allows the memory cells of the present invention to operate as either single level cells or multiple level cells.

Since neither Fowler-Nordheim nor hot electron injection is used for programming the cells of the present invention, the tunnel oxide is not damaged during programming. Thus, the reliability of the tunnel oxide is increased over a typical flash memory device and the number of program cycles is infinite.

Figures 11, 12:
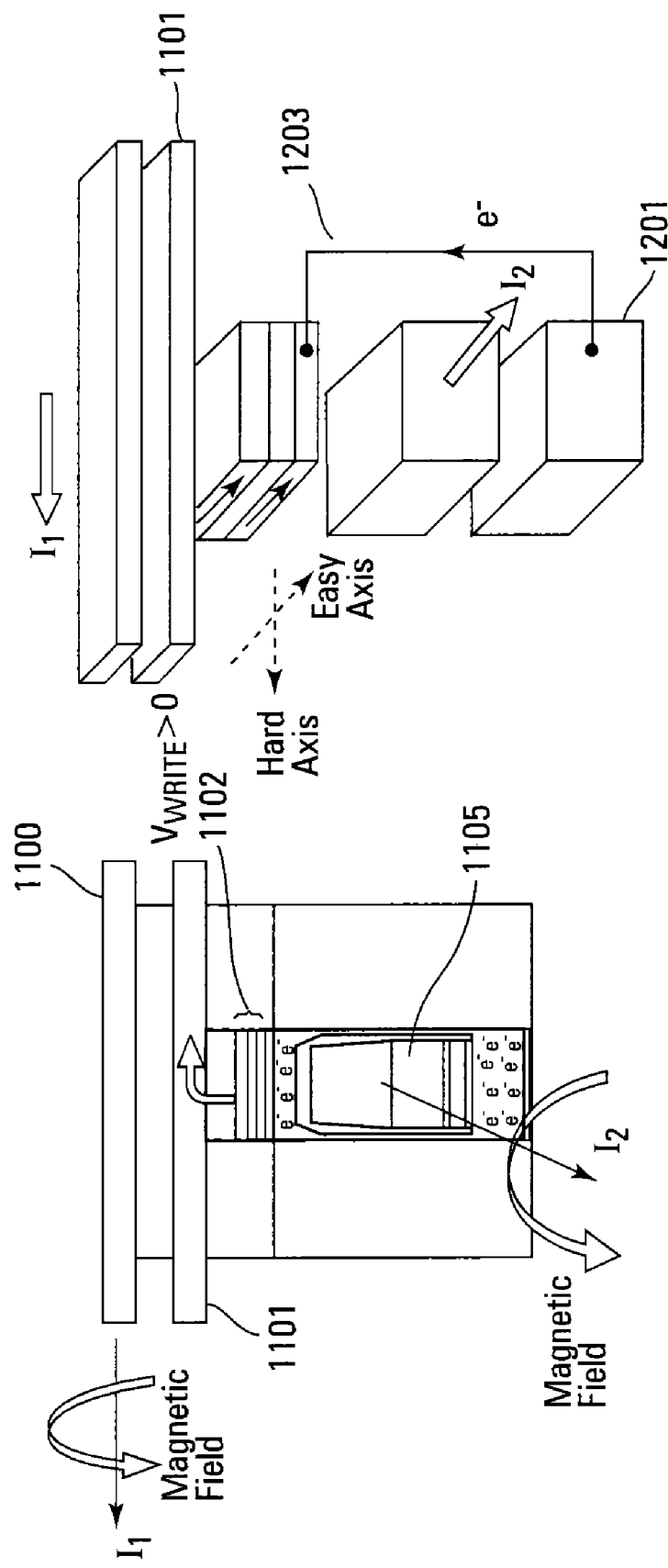
FIG. 11 shows a cross-sectional view of one embodiment of an erase method of the present invention.
FIG. 12 shows a cross-sectional view of one embodiment of the erase method of the present invention.

FIGS. 11 and 12 illustrate schematic cross-sectional views of one embodiment of a method for erasing the magnetic memory devices of the present invention. The erase operation is substantially similar to the program operation as previously described. One difference is that the program/erase line 1101 is grounded or biased at a voltage level that is only slightly positive.

In the same manner as programming, the resistance of the MTJ 1102 is reduced by the magnetic fields generated by currents $I_1$ through the cell select line 1100 and $I_2$ through the word line 1105. The ground or slightly positive biasing of the program/erase line 1101 attracts the electrons 1203 from the floating gate 1201.

Reading the memory cells of the present invention is accomplished by a current flowing in the opposite direction than the program/erase operations. This "raises" the MTJ to its highest resistance state and prevents any leakage of charge. A stored charge on the floating gate of the memory cell causes a $V_t$ shift that, with the proper combination of voltage on the substrate, drain region, and source region, will cause it to be read as a logical "0" or a logical "1". Similar techniques can be used to read the states of multiple level cells.

In one embodiment, to read a single level cell, the word line is biased at 4.5V and the cell select line is biased at ground potential. The substrate is also at ground potential. The digit line, which is also referred to as a bit line, is coupled to the drain regions and is biased at 0.1V. The program/erase line is left floating.

The above embodiments illustrated a NAND architecture memory array. The magnetic memory cells of the present invention can also be incorporated into a NOR architecture memory array as illustrated in FIGS. 13 and 14.

Figure 13:
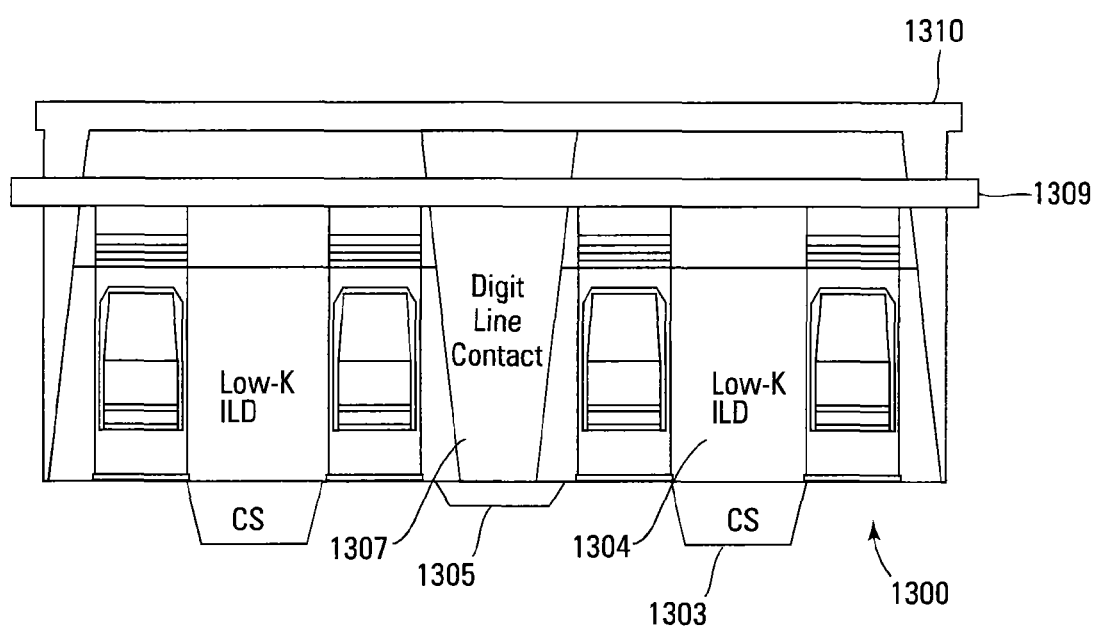
FIG. 13 shows a cross-sectional view of one embodiment of the magnetic memory cell in a NOR configuration.
Figure 14:
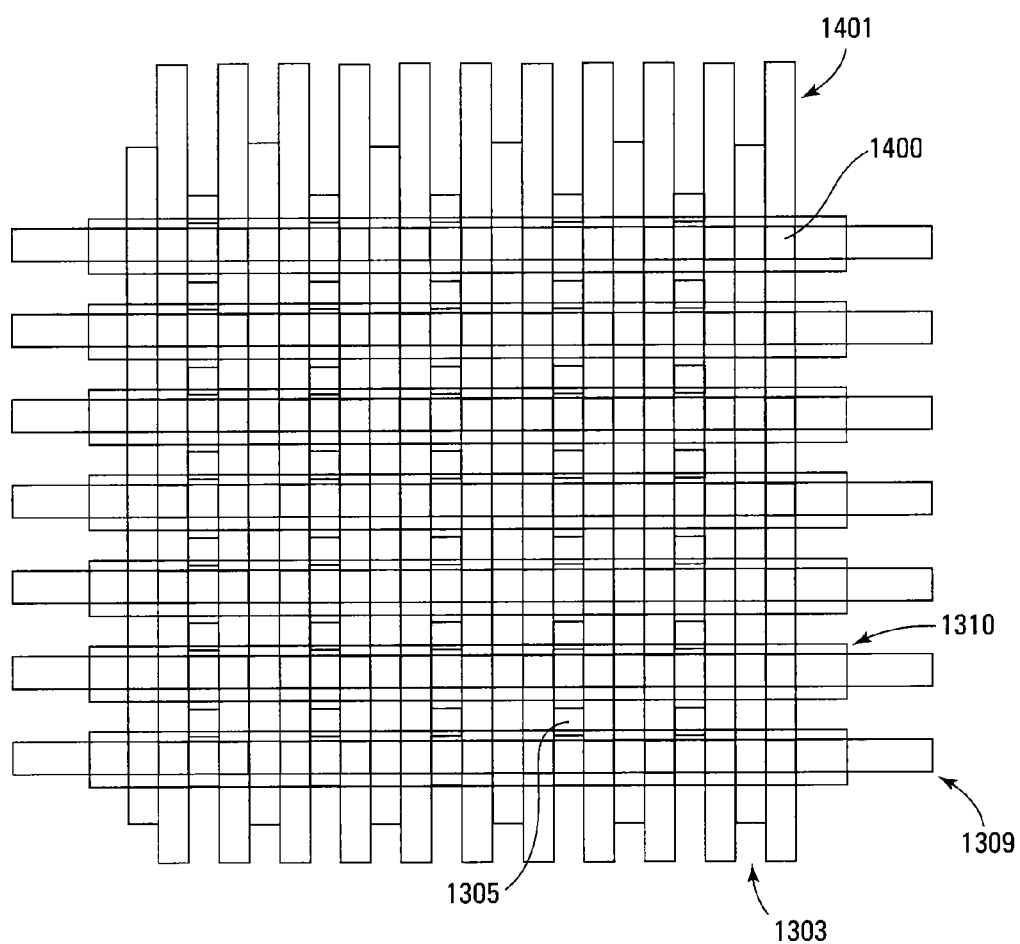
FIG. 14 shows a top plan view of one embodiment of a NOR layout of control lines in accordance with the embodiment of FIG. 13.

FIG. 13 illustrates a cross-sectional view of a NOR embodiment of the magnetic non-volatile memory cells of the present invention. This view is across the active areas. The cell structure 1300 is substantially similar as that described previously.

In this embodiment, the cell select line 1310 acts as a digit line. It is coupled to digit line contacts 1307 that couple the cell's drain regions 1305 to the select line 1310. In this view, the digit line contact 1307 is formed behind the program/erase line 1309.

A common source line 1303 is formed in the substrate between rows of memory cells. In this embodiment, a low-k inter-level dielectric 1304 is formed between cells and over the common source lines 1303.

With the help of refresh circuitry used in DRAMs and is well known in the art, the NOR embodiment of the semiconductor magnetic memory can act as a DRAM memory array as well. This can be the case where the MTJs are sufficiently thin and allow charge to bleed through them via direct tunneling mechanisms. As a result, the memory cell loses charge from its floating gate. This then needs to be replenished with the help of a refresh cycle. Thus, the memory cell behaves as a volatile or non-volatile memory, depending on the MTJ "OFF" state leakage behavior. The idea of refresh is illustrated in FIG. 17.

Figure 17:
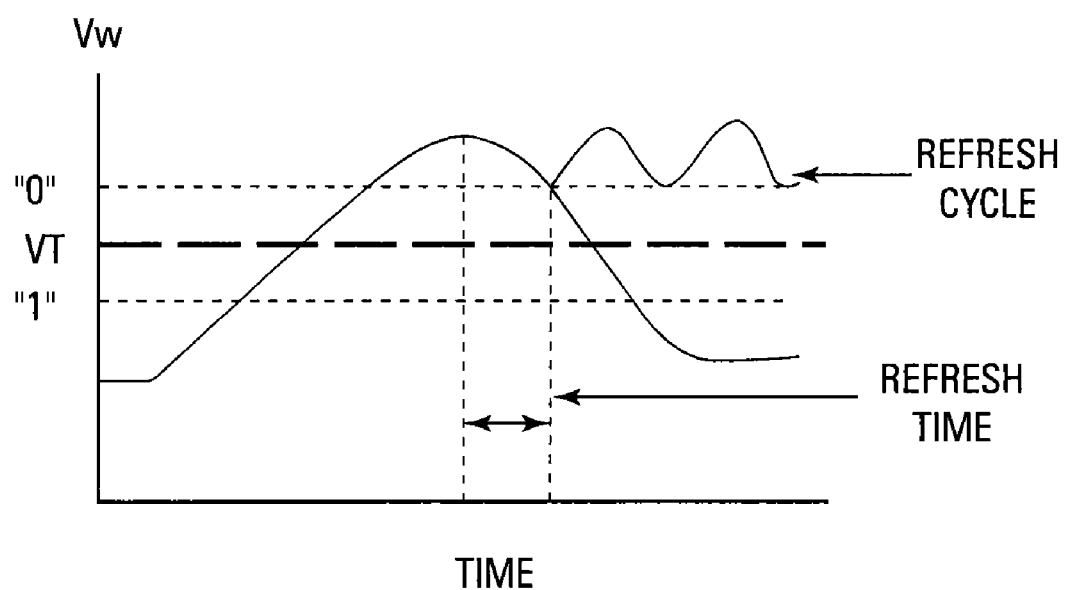
FIG. 17 shows a plot of time versus write voltage $V_{write}$ including the refresh cycle for a DRAM embodiment of the present invention.

FIG. 17 illustrates a plot of time versus the write voltage, $V_{write}$. $V_t$ is the threshold voltage dividing the logical "0" state from the logical "1" state.

FIG. 14 illustrates a top plan view of one embodiment of a layout of the NOR array of the present invention. The layout is comprised of the drain regions 1305 and common source lines 1303 as illustrated in the embodiment of FIG. 13. Also, the program/erase lines 1309 and underlying digit lines 1310 are shown. As in the NAND embodiment, a memory cell 1400 is formed at the intersection of each word line 1401 with the program/erase lines 1309 and digit lines 1310.

Figure 15:
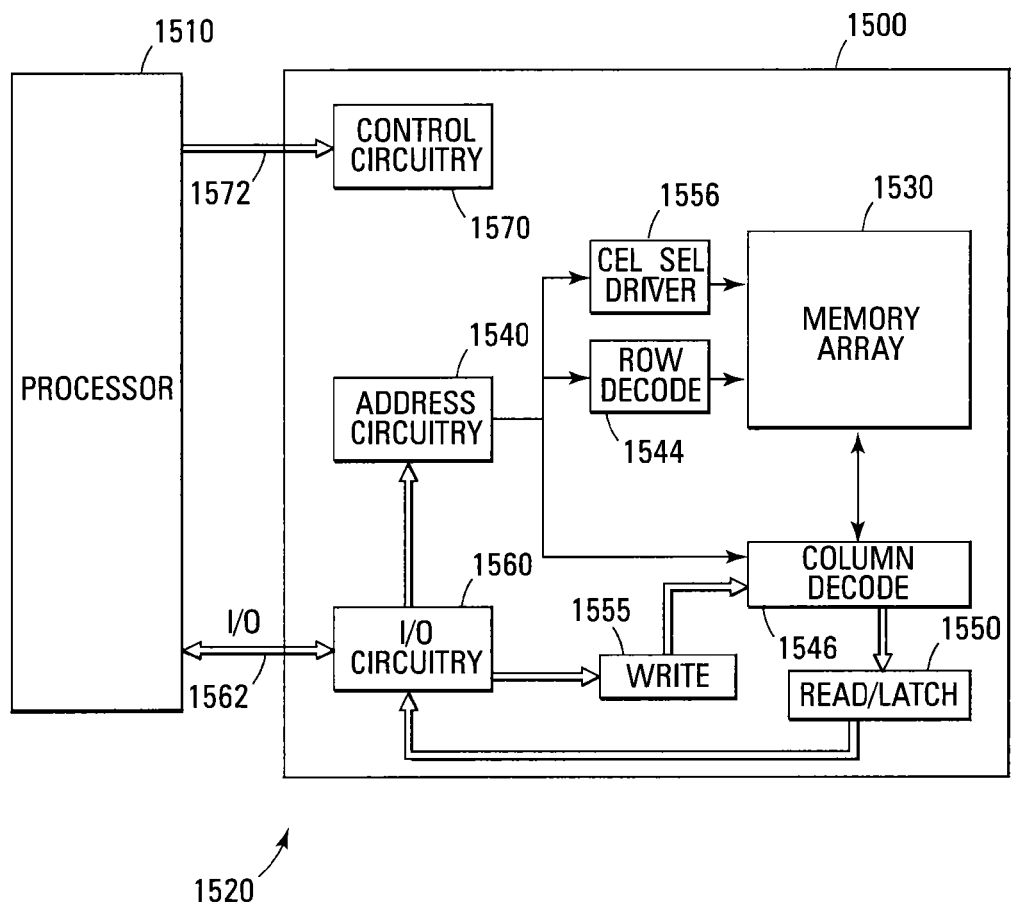
FIG. 15 shows a block diagram of an electronic memory system of the present invention.

FIG. 15 illustrates a functional block diagram of a memory system 1520 comprising a memory device 1500 coupled to a processor 1510. The processor 1510 may be a microprocessor or some other type of controlling circuitry. They memory system 1520 can be made up of separate integrated circuits or both the processor 1510 and memory device 1500 on the same integrated circuit. The memory device 1500 has been simplified to focus on features of the memory that are helpful in understanding the present invention.

The memory device includes an array of memory cells 1530 incorporating the magnetic memory cells of the present invention. The memory array 1530 can be a random access memory array (RAM) such as a dynamic random access memory array (DRAM), a flash memory array, or some other memory technology. The memory cells can be non-volatile flash memory cells, volatile memory cells, or a combination of volatile and non-volatile cells.

The memory array 1530 is arranged in banks of rows and columns. The control gates of each row of memory cells are coupled with a word line while the drain regions of the memory cells are coupled to bit lines. The source regions of the memory cells are coupled to source lines. As is well known in the art, the connection of the cells to the bit lines and source lines depends on whether the array is a NAND architecture, a NOR architecture, an AND architecture or some other memory array architecture.

A CEL_SEL driver circuit 1556 is coupled to the address circuitry to generate the currents required for the CEL_SEL lines of the memory array 1530. The output of the CEL_SEL circuit 1556 is coupled to the CEL_SEL lines that have been previously described.

In a NAND array, an address buffer circuit 1540 is provided to latch address signals provided over I/O connections 1562 through the I/O circuitry 1560. Address signals are received and decoded by a row decoder 1544 and a column decoder 1546 to access the memory array 1530. The word line/row decoder 1544 can be a current source as well as a voltage source. It will be appreciated by those skilled in the art that, with the benefit of the present description, the number of address input connections depends on the density and architecture of the memory array 1530. That is, the number of addresses increases with both increased memory cell counts and increased bank and block counts.

The memory integrated circuit 1500 reads data in the memory array 1530 by sensing voltage or current changes in the memory array columns using sense/buffer circuitry 1550. The sense/buffer circuitry, in one embodiment, is coupled to read and latch a row of data from the memory array 1530. Data input and output buffer circuitry 1560 is included for bi-directional data communication over the I/O connections 1562 with the processor 1510. Write circuitry 1555 is provided to write data to the memory array.

Control circuitry 1570 decodes signals provided on control connections 1572 from the processor 1510. These signals include chip enable signals, write enable signals, and address latch signals that are used to control the operations on the memory array 1530, including data read, data write, and erase operations. In one embodiment, the control circuitry 1570 is responsible for executing the programming, erase, and read operations of the present invention. The control circuitry 1570 may be a state machine, a sequencer, or some other type of controller.

The memory device illustrated in FIG. 15 has been simplified to facilitate a basic understanding of the features of the memory. A more detailed understanding of internal circuitry and functions of flash memories are known to those skilled in the art.

Figure 16:
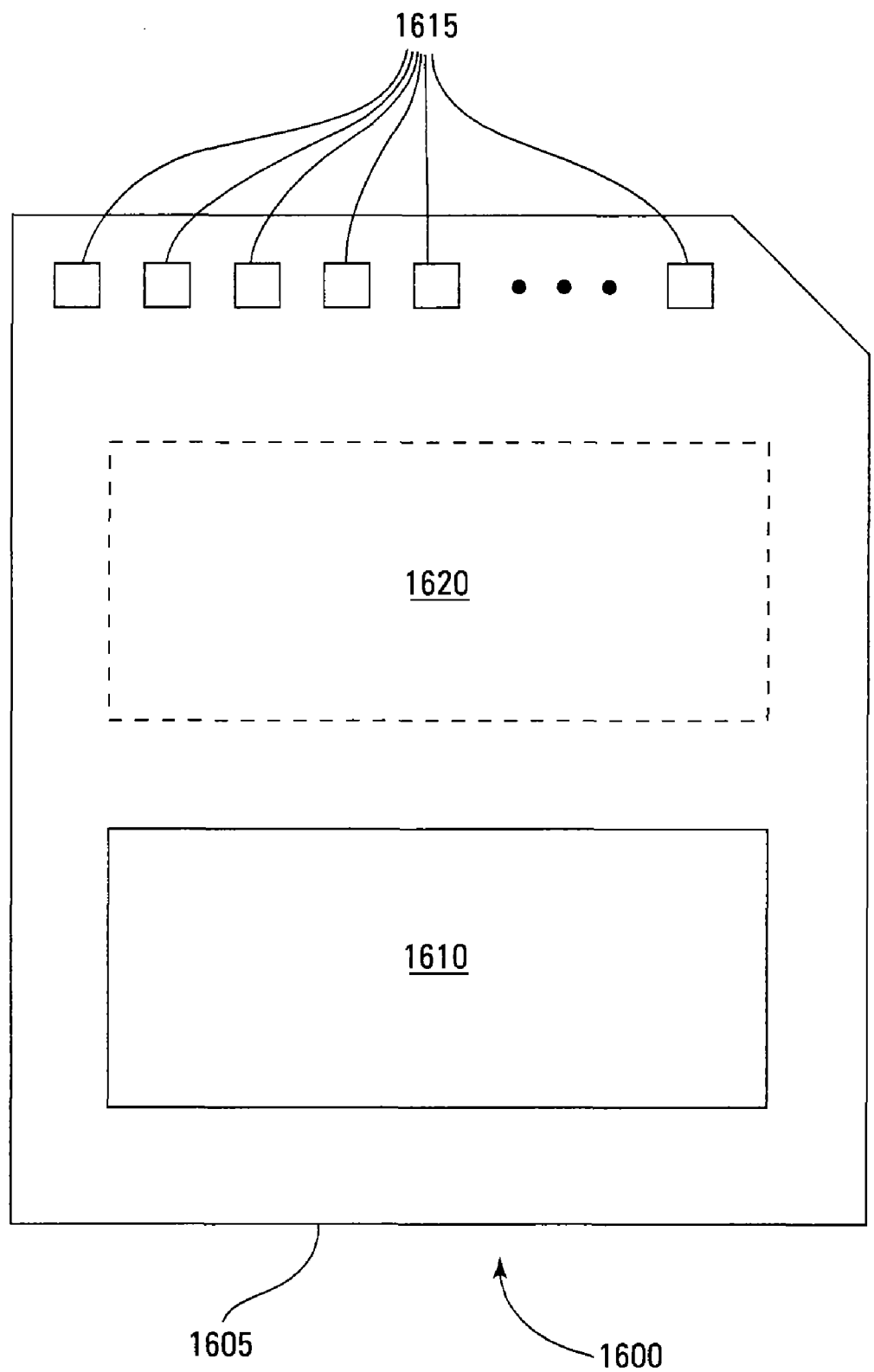
FIG. 16 shows a block diagram of one embodiment of a memory module of the present invention.

FIG. 16 is an illustration of an exemplary memory module 1600. Memory module 1600 is illustrated as a memory card, although the concepts discussed with reference to memory module 1600 are applicable to other types of removable or portable memory, e.g., USB flash drives, and are intended to be within the scope of "memory module" as used herein. In addition, although one example form factor is depicted in FIG. 16, these concepts are applicable to other form factors as well.

In some embodiments, the memory module 1600 includes a housing 1605 (as depicted) to enclose one or more memory devices 1610, though such a housing is not essential to all devices or device applications. At least one memory device 1610 is a non-volatile memory [including or adapted to perform elements of the invention]. Where present, the housing 1605 includes one or more contacts 1615 for communication with a host device. Examples of host devices include digital cameras, digital recording and playback devices, PDAs, personal computers, memory card readers, interface hubs and the like. For some embodiments, the contacts 1615 are in the form of a standardized interface. For example, with a USB flash drive, the contacts 1615 might be in the form of a USB Type-A male connector. For some embodiments, the contacts 1615 are in the form of a semi-proprietary interface, such as might be found on COMPACTFLASH memory cards licensed by SANDISK Corporation, MEMORYSTICK memory cards licensed by SONY Corporation, SD SECURE DIGITAL memory cards licensed by TOSHIBA Corporation and the like. In general, however, contacts 1615 provide an interface for passing control, address and/or data signals between the memory module 1600 and a host having compatible receptors for the contacts 1615.

The memory module 1600 may optionally include additional circuitry 1620 that may be one or more integrated circuits and/or discrete components. For some embodiments, the additional circuitry 1620 may include a memory controller for controlling access across multiple memory devices 1610 and/or for providing a translation layer between an external host and a memory device 1610. For example, there may not be a one-to-one correspondence between the number of contacts 1615 and a number of I/O connections to the one or more memory devices 1610. Thus, a memory controller could selectively couple an I/O connection (not shown in FIG. 16) of a memory device 1610 to receive the appropriate signal at the appropriate I/O connection at the appropriate time or to provide the appropriate signal at the appropriate contact 1615 at the appropriate time. Similarly, the communication protocol between a host and the memory module 1600 may be different than what is required for access of a memory device 1610. A memory controller could then translate the command sequences received from a host into the appropriate command sequences to achieve the desired access to the memory device 1610. Such translation may further include changes in signal voltage levels in addition to command sequences.

The additional circuitry 1620 may further include functionality unrelated to control of a memory device 1610 such as a logic functions as might be performed by an ASIC (application specific integrated circuit). Also, the additional circuitry 1620 may include circuitry to restrict read or write access to the memory module 1600, such as password protection, biometrics or the like. The additional circuitry 1620 may include circuitry to indicate a status of the memory module 1600. For example, the additional circuitry 1620 may include functionality to determine whether power is being supplied to the memory module 1600 and whether the memory module 1600 is currently being accessed, and to display an indication of its status, such as a solid light while powered and a flashing light while being accessed. The additional circuitry 1620 may further include passive devices, such as decoupling capacitors to help regulate power requirements within the memory module 1600.

CONCLUSION

In summary, the embodiments of the present invention provide a semiconductor magnetic memory device incorporating a magnetic tunneling junction to control access to a memory cell structure. The memory cell uses a floating gate that wraps around the control gate/word line to enable the floating gate to directly contact the lower layer of the MTJ.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is intended that this invention be limited only by the following claims and equivalents thereof.

What is claimed is:

1. A method for programming a memory cell comprising a magnetic tunneling junction formed under a program/erase line and above a floating gate transistor, the method comprising:
    applying a write voltage to the program/erase line;
    opening the magnetic tunneling junction for a predetermined time period; and
    transferring a charge from the program/erase line on a first side of the magnetic tunneling junction, through the open magnetic tunneling junction, to a floating gate of the floating gate transistor on a second side of the magnetic tunneling junction.

2. The method of claim 1 wherein a level of charge transferred to the floating gate changes in response to the predetermined time period.

3. The method of claim 2 wherein the level of charge is determined by $(V_{write}/R_{MTJ})*\Delta t$ where $V_{write}$ is the write voltage applied to the program/erase line, $R_{MTJ}$ is a resistance of the magnetic tunneling junction, and $\Delta t$ is the predetermined time.

4. The method of claim 3 wherein the resistance of the magnetic tunneling junction changes in response to a first current in a cell select line and a second current in a cell word line.

5. The method of claim 1 and further including isolating the memory cell by passing currents through a select line and a word line that are both coupled to the memory cell.

6. A method for programming a selected memory cell in an array of memory cells each comprising a magnetic tunneling junction formed under a program/erase line and above a floating gate transistor, the method comprising:
    isolating the selected memory cell from the array of memory cells;
    applying a write voltage to the program/erase line;
    reducing a resistance of the magnetic tunneling junction for a predetermined time period; and
    programming data from the program/erase line through the magnetic tunneling junction to a floating gate of the floating gate transistor exposed by the reduced resistance of the magnetic tunneling junction wherein the data is determined in response to the predetermined time period.

7. The method of claim 6 wherein a threshold voltage programmed into the selected memory cell is determined by the predetermined time period.

8. The method of claim 6 wherein the predetermined time period determines if the selected memory cell is programmed as a single level cell or a multiple level cell.

9. The method of claim 6 wherein each memory cell of the array of memory cells is configured to operate as either a single level cell or a multiple level cell.

10. The method of claim 6 wherein reducing the resistance of the magnetic tunneling junction comprises generating a plurality of magnetic fields along different axes above the magnetic tunneling junction.

11. The method of claim 10 wherein the plurality of magnetic fields are generated on orthogonal axes.

12. The method of claim 11 wherein a first magnetic field of the plurality of magnetic fields is generated by a first current through a select line coupled to the selected memory cell and a second magnetic field of the plurality of magnetic fields is generated by a second current through a word line coupled to the selected memory cell wherein the word line is formed orthogonal to the select line.

13. The method of claim 6 wherein the method for programming is executed by control circuitry.

14. The method of claim 13 wherein the control circuitry is part of a memory device comprising the array of memory cells.

15. The method of claim 6 and further including refreshing the selected memory cell after the programming.

16. The method of claim 15 wherein the refreshing of the selected memory cell is accomplished with DRAM refresh circuitry.

17. The method of claim 15 wherein the array of memory cells comprises a NOR architecture and the selected memory cell acts like a DRAM cell.

18. The method of claim 17 wherein a charge programmed to the floating gate leaks through the magnetic tunneling junction.

19. The method of claim 18 wherein the leaking results from direct tunneling mechanisms.

\* \* \* \* \*